(12) United States Patent
Kurachi

(10) Patent No.: US 7,714,370 B2
(45) Date of Patent: May 11, 2010

(54) SEMICONDUCTOR STORAGE DEVICE HAVING AN SOI STRUCTURE

(75) Inventor: Ikuo Kurachi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 361 days.

(21) Appl. No.: 11/727,481

(22) Filed: Mar. 27, 2007

(65) Prior Publication Data

US 2007/0228467 A1 Oct. 4, 2007

(30) Foreign Application Priority Data

Mar. 31, 2006 (JP) ............................. 2006-096574

(51) Int. Cl.
*H01L 31/062* (2006.01)
*H01L 31/113* (2006.01)
(52) U.S. Cl. .................. 257/298; 257/347; 257/71; 257/E21.7
(58) Field of Classification Search ................ 257/347, 257/298, 71, E21.7
See application file for complete search history.

(56) References Cited

U.S. PATENT DOCUMENTS

| 5,463,238 | A * | 10/1995 | Takahashi et al. .......... 257/351 |
| 6,177,703 | B1 | 1/2001 | Cunningham |
| 6,590,229 | B1 * | 7/2003 | Yamazaki et al. ............. 257/71 |
| 6,611,458 | B2 | 8/2003 | Ishibashi et al. |
| 2002/0139980 | A1 * | 10/2002 | Yamazaki .................... 257/72 |
| 2004/0007748 | A1 * | 1/2004 | Sakama et al. ............. 257/410 |
| 2004/0124469 | A1 * | 7/2004 | Makita ........................ 257/347 |
| 2006/0022242 | A1 * | 2/2006 | Sugatani et al. ............. 257/296 |
| 2006/0170044 | A1 * | 8/2006 | Tu .............................. 257/347 |

FOREIGN PATENT DOCUMENTS

| JP | 2001-229690 | 8/2001 |
| JP | 2003-501806 | 1/2003 |

* cited by examiner

*Primary Examiner*—Jerome Jackson, Jr.
*Assistant Examiner*—David Z Chen
(74) *Attorney, Agent, or Firm*—Volentine & Whitt, P.L.L.C.

(57) ABSTRACT

A semiconductor storage device includes: a MOSFET formed on an SOI layer of the transistor forming region; and a MOS capacitor formed on the SOI layer of the capacitor forming region. The MOSFET includes: a gate insulating film formed; a floating gate electrode; a source layer and a drain layer formed; a channel region; a high-concentration diffusion layer, and impurities of a same type as impurities which are diffused in the channel region are diffused at a high concentration in the high-concentration diffusion layer; and a silicide layer covering the high-concentration diffusion layer and the source layer. The MOS capacitor includes a capacitor electrode at the SOI layer. The capacitor electrode of the MOS capacitor is disposed so as to oppose an end portion of the floating gate electrode of the MOSFET, with the gate insulating film therebetween.

9 Claims, 10 Drawing Sheets

F I G. 6
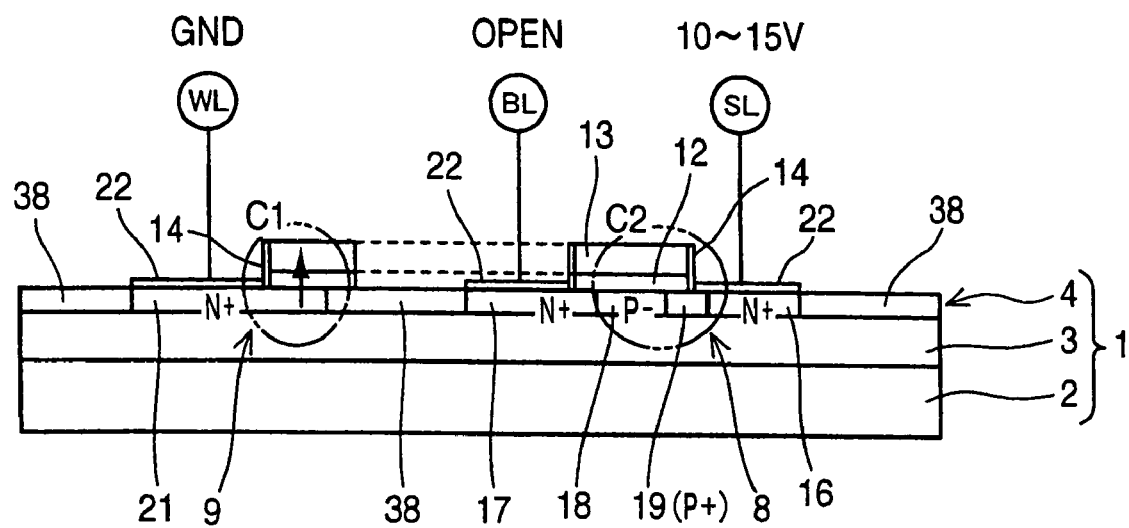

F I G. 7
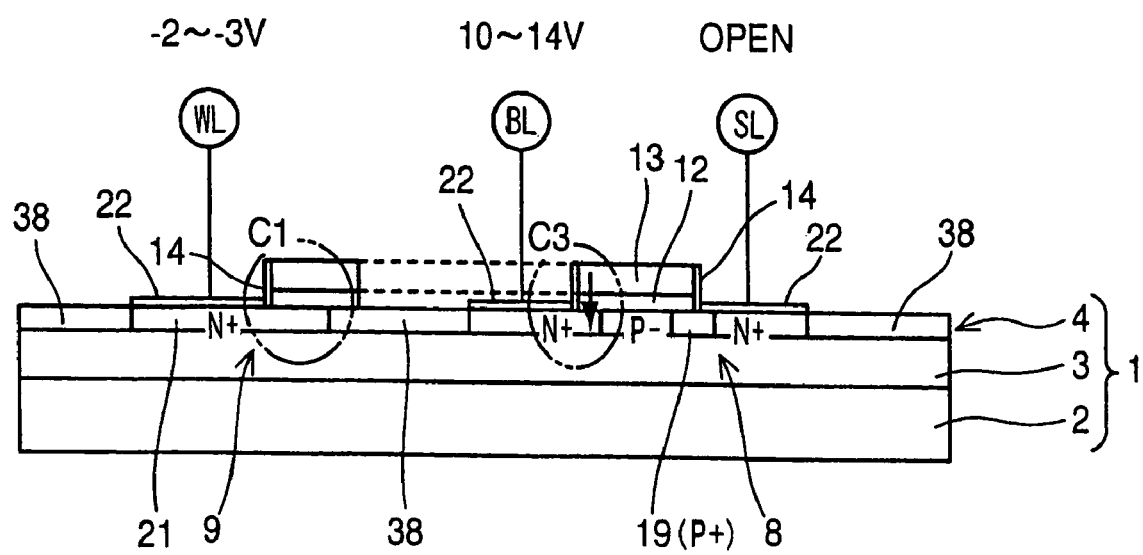

SEMICONDUCTOR STORAGE DEVICE HAVING AN SOI STRUCTURE

CROSS-REFERENCE TO RELATED APPLICATION

This application claims priority under 35 USC 119 from Japanese Patent Application No. 2006-096574, the disclosure of which is incorporated by reference herein.

BACKGROUND OF THE INVENTION

1. Field of the Invention

The present invention relates to a semiconductor storage device having an electrically rewritable, nonvolatile memory, and to a method of fabricating the semiconductor storage device.

2. Description of the Related Art

In a conventional semiconductor storage device, a selection transistor is set in series with a floating gate transistor, and the floating gate electrode of this floating gate transistor is capacitatively coupled via a thin tunnel oxide film on a high-concentration N-type diffusion region formed on a bulk substrate, and a single poly flash EEPROM (Electrically Erasable and Programmable Read Only Memory) is formed. Voltage is applied to the control line of the floating gate transistor, the source layer thereof is grounded, and the data of the storage elements is erased (refer to, for example, Japanese National Publication No. 2003-501806, and mainly, page 8, paragraphs 0015-0016, and FIG. 2 and FIG. 4).

Further, there is also a technique in which a flash memory cell is structured by connecting, in series at one floating gate electrode, two transistors which are formed respectively at a P well layer and an N well layer forming a bulk substrate. In the erasing operation, the control gate electrode and drain layer are grounded, voltage of 7 V is applied to the source layer, electrons are removed from the floating gate electrode in the tunnel current, and the threshold voltage of the flash memory is lowered. In the writing operation, the drain layer is grounded, voltage of 5 V is applied to the control gate and the source layer, hot electrons are injected in the floating gate electrode, the threshold voltage of the flash memory is raised, and the stored data is read-out in accordance with the magnitude of the threshold voltage (refer to, for example, Japanese Patent Application Laid-Open (JP-A) No. 2001-229690, page 5, paragraph 0011 to page 6, paragraph 0021, and FIG. 1).

In both of the above-described conventional techniques, a single poly flash EEPROM or a flash memory is formed on a bulk substrate. Therefore, the withstand voltage between the source and drain is high, and a writing operation such as described above is possible. However, in a semiconductor storage device of a fully depleted type SOI structure in which an SOI (Silicon On Insulator) layer formed from a silicon thin film is layered on a buried oxide film, there are the problems that it is difficult to sufficiently ensure the withstand voltage between the source and drain of a MOSFET (MOS Field Effect Transistor) formed at the SOI layer, charges cannot be injected through a gate oxide film into the floating gate electrode, and, when forming an electrically rewritable, nonvolatile memory at a semiconductor storage device of an SOI structure, writing operation cannot be carried out.

SUMMARY OF THE INVENTION

The present invention was developed in order to solve the above-described problems, and an object thereof is to provide a means for forming an electrically rewritable, nonvolatile memory at a semiconductor storage device having an SOI structure.

A semiconductor device of the present invention for overcoming the above-described problems is a semiconductor storage device including: a semiconductor substrate formed by a supporting substrate, a buried oxide film formed on the supporting substrate, and an SOI layer formed on the buried oxide film; an element isolating layer insulating and isolating the SOI layer at a transistor forming region and a capacitor forming region which are set at the semiconductor substrate; a MOSFET formed on the SOI layer of the transistor forming region; and a MOS capacitor formed on the SOI layer of the capacitor forming region, wherein the MOSFET includes: a gate insulating film formed on the SOI layer; a floating gate electrode formed on the gate oxide film; a source layer and a drain layer formed at the SOI layer at both sides of the floating gate electrode; a channel region formed between the source layer and the drain layer; a high-concentration diffusion layer which is formed at the source layer in a vicinity of an interface between the source layer and the channel region, and which contacts the channel region, and impurities of a same type as impurities which are diff-used in the channel region are diffused at a high concentration in the high-concentration diffusion layer; and a silicide layer covering the high-concentration diffusion layer and the source layer, and the MOS capacitor includes: a capacitor electrode at the SOI layer, and impurities of a same type as the source layer are diffused at a high concentration in the capacitor electrode, and the capacitor electrode of the MOS capacitor is disposed so as to oppose an end portion of the floating gate electrode of the MOSFET, with the gate insulating film therebetween.

In this way, the present invention has the following effects. The source layer or the drain layer, which is electrically connected to the channel region via the high-concentration diffusion layer by the silicide layer, is set in an open state, and the electrostatic capacity of the MOSFET can be varied. By utilizing the capacitance coupling with the MOS capacitor, the injection of charges into or the removal of charges from the floating gate electrode is possible regardless of the withstand voltage between the source and the drain. Even at a semiconductor storage device using a MOSFET of an SOI structure in which the withstand voltage between the source and drain is low, an electrically rewritable, nonvolatile memory having excellent reliability can be formed.

BRIEF DESCRIPTION OF THE DRAWINGS

Preferred exemplary embodiments of the present invention will be described in detail based on the following figures, wherein:

FIG. 6 is an explanatory drawing showing an erasing operation of a storage element of the first exemplary embodiment;

FIG. 7 is an explanatory drawing showing a writing operation of the storage element of the first exemplary embodiment;

DETAILED DESCRIPTION OF THE INVENTION

Exemplary embodiments of a semiconductor storage device and a method of fabrication thereof in accordance with the present invention will be described hereinafter with reference to the drawings.

First Exemplary Embodiment

Figure 1:
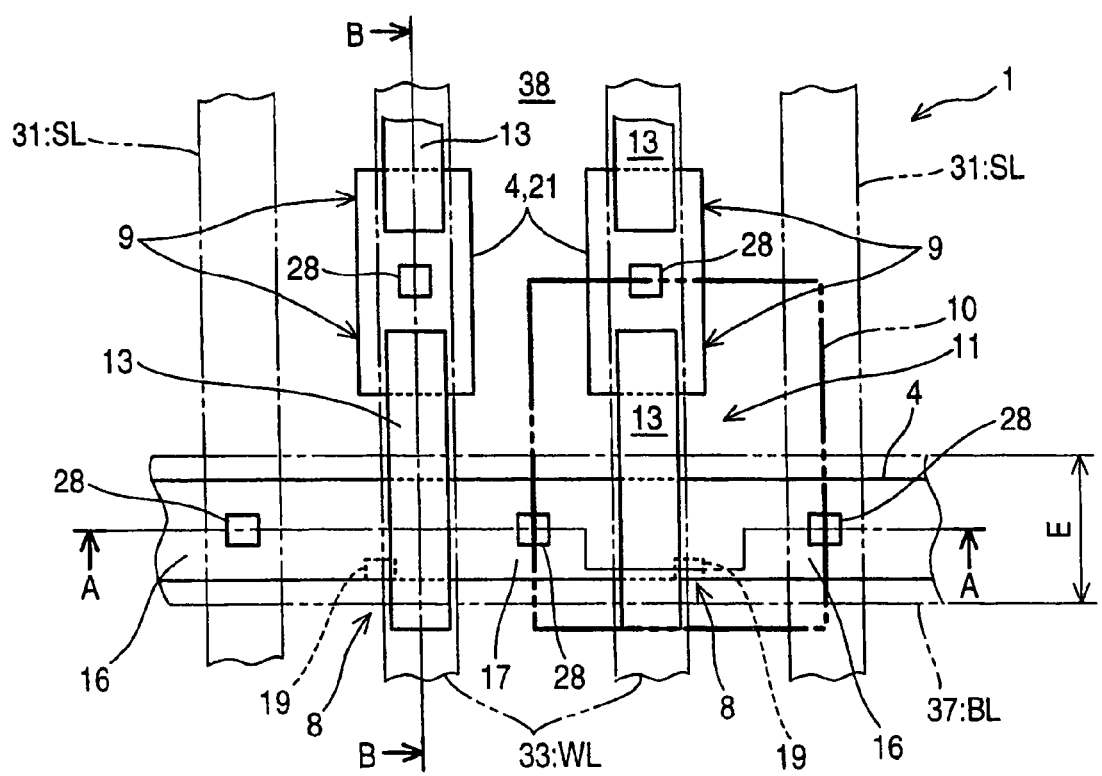
FIG. 1 is an explanatory drawing showing a top surface of a semiconductor storage device of a first exemplary embodiment.
Figure 2:
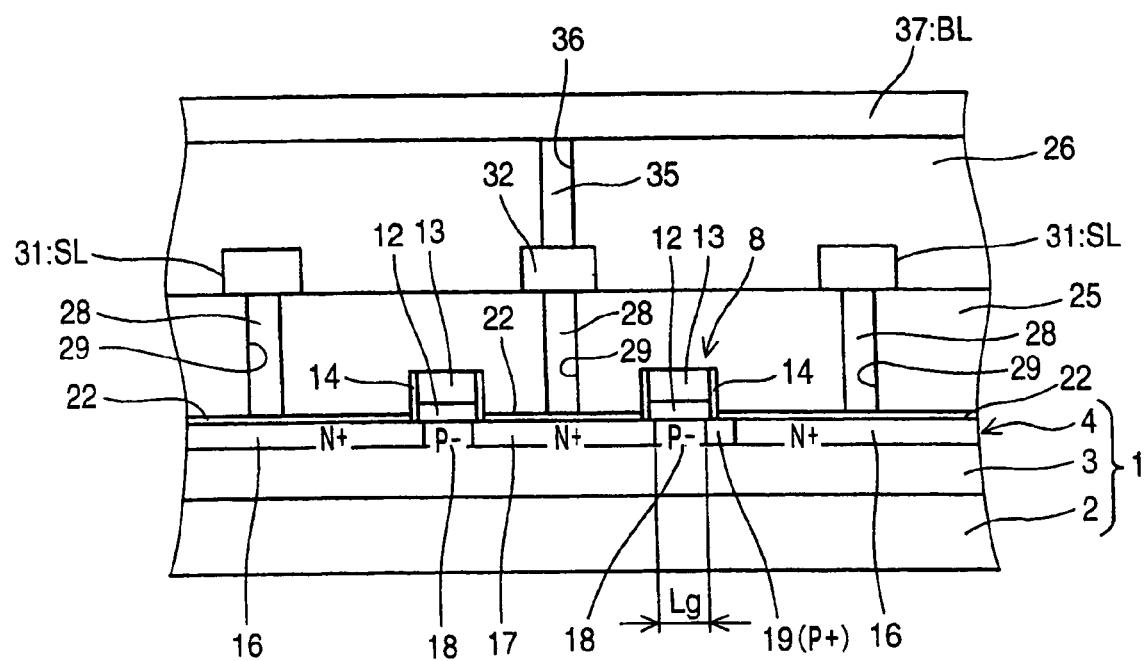
FIG. 2 is an explanatory drawing showing a cross-section along cross-section line A-A in FIG. 1.
Figure 3:
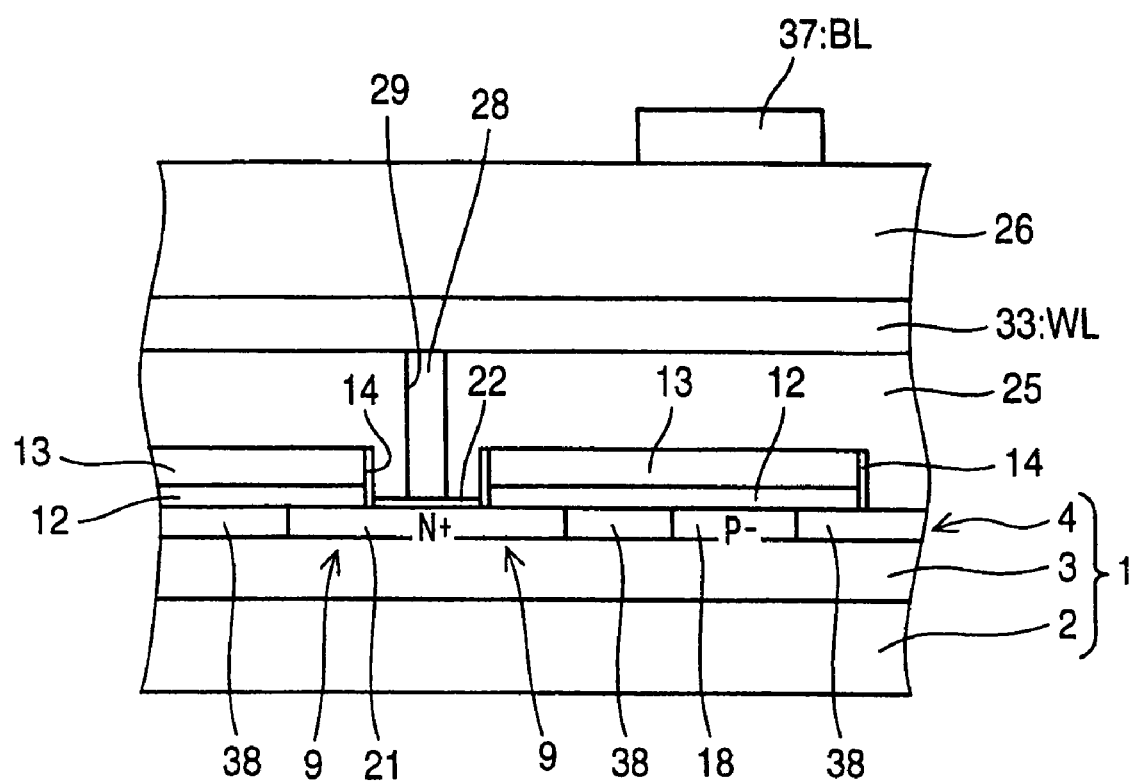
FIG. 3 is an explanatory drawing showing a cross-section along cross-section line B-B in FIG. 1.
Figure 4:
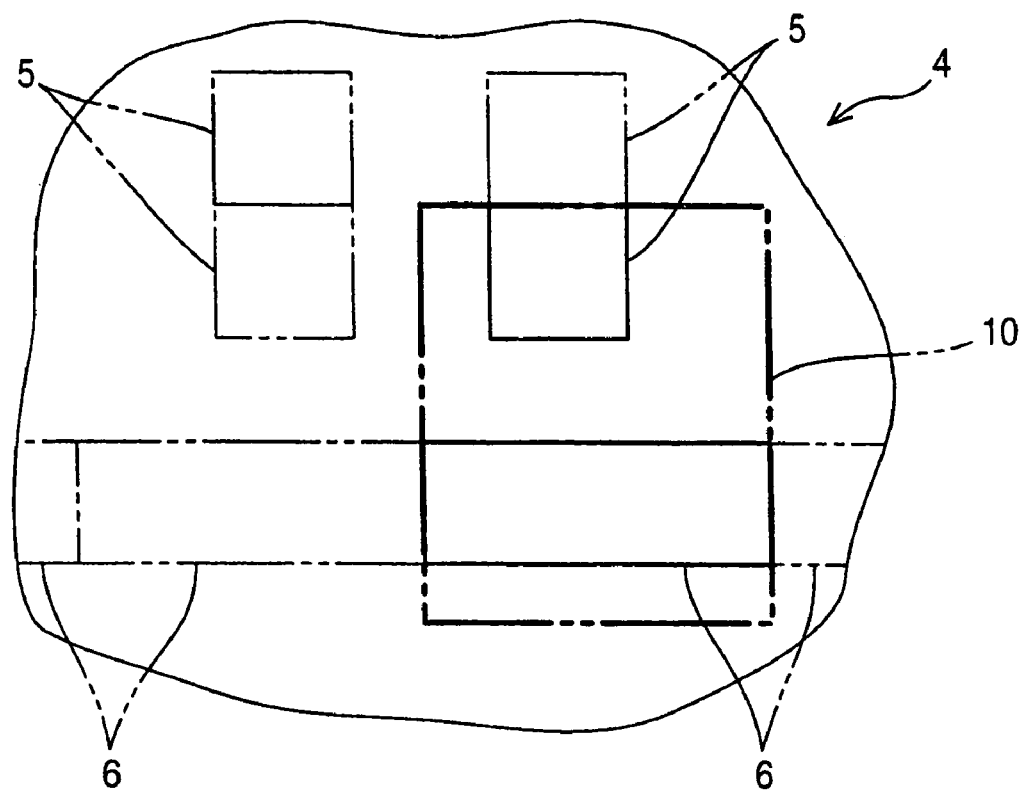
FIG. 4 is an explanatory drawing showing a set state of regions on an SOI layer of the first exemplary embodiment.
Figure 5:
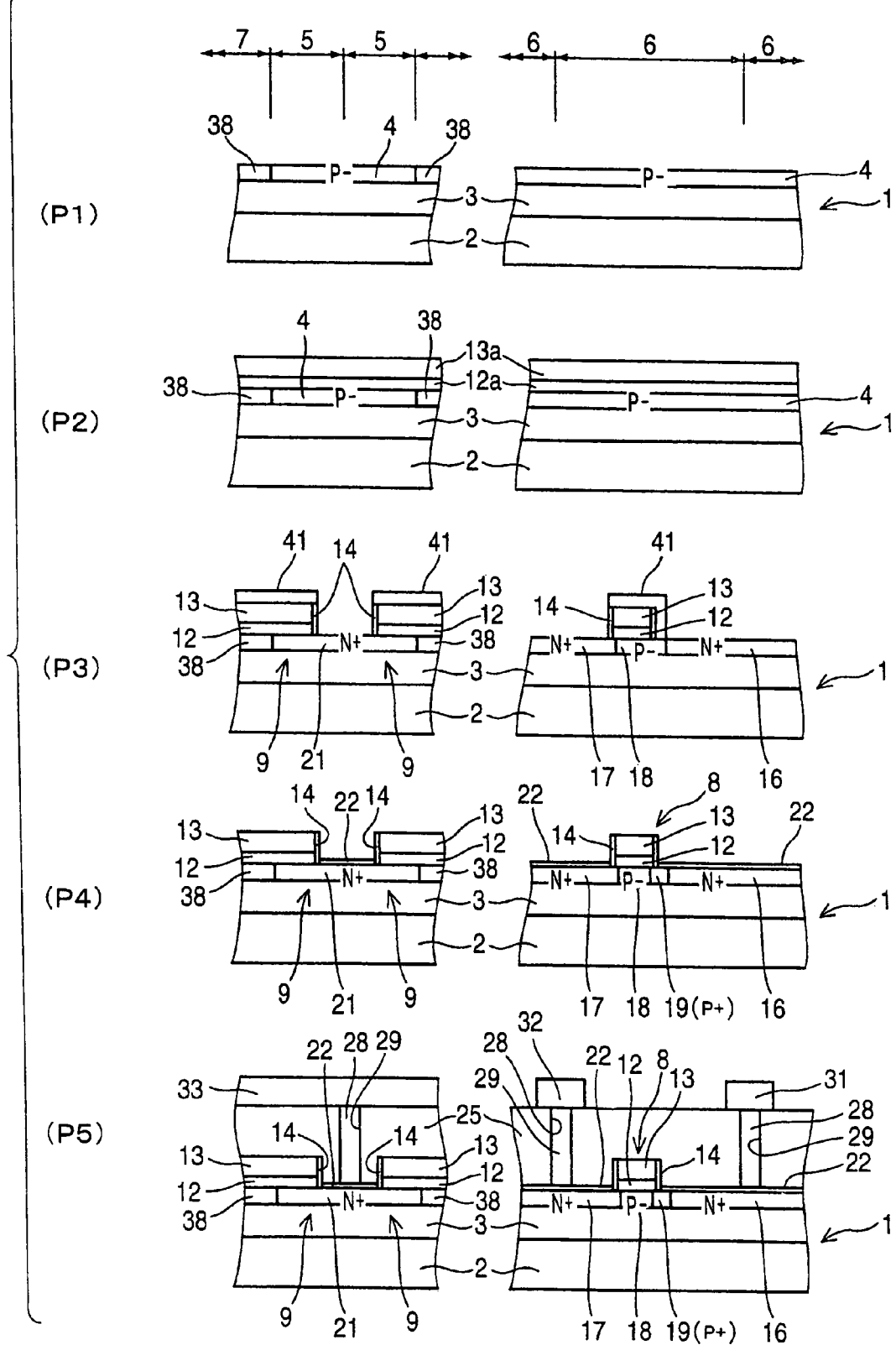
FIG. 5 is an explanatory drawing showing a method of fabricating the semiconductor storage device of the first exemplary embodiment.

FIG. 1 is an explanatory drawing showing a top surface of a semiconductor storage device of a first exemplary embodiment, FIG. 2 is an explanatory drawing showing a cross-section along cross-section line A-A in FIG. 1, FIG. 3 is an explanatory drawing showing a cross-section along cross-section line B-B in FIG. 1, FIG. 4 is an explanatory drawing showing a set state of regions on an SOI layer of the first exemplary embodiment, FIG. 5 is an explanatory drawing showing a method of fabricating the semiconductor storage device of the first exemplary embodiment, FIG. 6 is an explanatory drawing showing an erasing operation of a storage element of the first exemplary embodiment, and FIG. 7 is an explanatory drawing showing a writing operation of the storage element of the first exemplary embodiment.

Note that FIG. 1 is drawn in a state in which first and second interlayer insulating films are removed.

In FIG. 1, FIG. 2, and FIG. 3, reference numeral 1 denotes a semiconductor substrate, and is a substrate of an SOI structure formed from a supporting substrate 2 which is formed from silicon (Si), a BOX (Buried Oxide) film 3 which is formed from silicon oxide (SiO$_2$) and has a film thickness of about 1500 Å (angstroms) and is formed on the supporting substrate 2, and an SOI layer 4 which serves as a silicon substrate region and is formed from single crystal silicon of a film thickness of about 500 Å and is formed on the buried oxide film 3.

As shown in FIG. 4, capacitor forming regions 5 for forming MOS (Metal Oxide Semiconductor) capacitors 9 (to be described later), transistor forming regions 6 for forming MOSFETs, and element isolating regions 7 for forming element isolating layers 38 (to be described later) which surround the respective peripheries of the capacitor forming regions 5 and the transistor forming regions 6 and which insulate and isolate the adjacent capacitor forming regions 5 and the transistor forming regions 6 from one another, are set on the SOI layer 4 of the present exemplary embodiment.

An nMOS element 8 which is one type of MOSFET is formed in each of the transistor forming regions 6 of the present exemplary embodiment, and the MOS capacitor 9 is formed in each of the capacitor forming regions 5. The nMOS element 8, which is formed in one transistor forming region 6, and the MOS capacitor 9, which is formed in the one capacitor forming region 5 in the vicinity thereof, are combined in series, such that a single memory element 11 is formed at a storage element forming region 10 shown by the dark two-dot chain line in FIG. 1 and FIG. 4. The memory element 11 functions as an electrically rewritable, one-bit, nonvolatile memory.

Reference numeral 12 denotes a gate insulating film, and, as shown in FIG. 2 and FIG. 3, is formed on the SOI layer 4, is used in common for the nMOS element 8 and the MOS capacitor 9, is formed from an insulating material such as silicon oxide or the like, and is an insulating film of a film thickness of about 50 to 150 Å.

Reference numeral 13 denotes a floating gate electrode, and is an electrode formed from polysilicon or the like and is disposed so as to oppose the SOI layer 4 of the capacitor forming region 5 and the transistor forming region 6 with the gate insulating film 12 sandwiched therebetween. As shown in FIG. 1, the floating gate electrode 13 divides the transistor forming region 6 in two at the central portion thereof, and is disposed so as to cover a portion of the transistor forming region 6 side on the capacitor forming region 5, and functions as a gate electrode which the nMOS element 8 and the MOS capacitor 9 use in common. Insulating films 14 formed from an insulating material such as silicon oxide or the like are formed at the side surfaces thereof. The floating gate-electrode 13 is in a floating state in which it is electrically insulated from the exterior by the gate oxide film 12, the insulating films 14, and the like.

A source layer 16 (N+) serving as a first diffusion layer and a drain layer 17 (N+) serving as a second diffusion layer, in which a relatively high concentration of N-type impurities such as arsenic (As) or the like are diffused (e.g., greater than or equal to $1 \times 10^{18}$ ion/cm$^3$), are formed at the both sides of the floating gate electrode 13 of the SOI layer 4 of the transistor forming region 6. A region (P−) of the SOI layer 4, in which a relatively low concentration of P-type impurities such as boron (B) or the like are diffused and which is beneath the floating gate electrode 13 and which is sandwiched between the source layer 16 and the drain layer 17, functions as a channel region 18 (third diffusion layer) of the nMOS element 8.

Reference numeral 19 denotes a P+ diffusion layer which serves as a high-concentration diffusion layer. The P+ diffusion layer 19 is formed at the source layer 16 in a vicinity of the interface between the source layer 16 and the channel region 18 to a length of about ⅕ of the gate width (the length, shown by E in FIG. 1, of the SOI layer 4 in the direction orthogonal to the gate length which is shown by Lg in FIG. 2) along the interface so as to directly contact the channel region 18, and impurities (in the present exemplary embodiment, P type) of the same type as the impurities diffused in the channel region 18 are diffused therein in a relative high concentration (e.g., greater than or equal to $1 \times 10^{20}$ ion/cm$^3$). The P+ diffusion layer 19 functions to electrically connect the source layer 16 and the channel region 18.

Reference numeral 21 denotes a capacitor electrode which, as shown in FIG. 3, is a diffused layer (N+ in the present exemplary embodiment) which is formed by diffusing a relatively high concentration (e.g., greater than or equal to $1 \times 10^{18}$ ion/cm$^3$) of impurities (N type in the present exemplary embodiment) of the same type as the source layer 16, in the SOI layer 4 of the capacitor forming region 5. A partial region of the capacitor electrode 21 at the nMOS element 8 side thereof is disposed so as to oppose an end portion of the floating gate electrode 13, with the gate insulating film 12 therebetween.

Reference numeral 22 denotes a silicide layer, and is a layer which is conductive and formed from a compound formed by compounding a siliciding material such as cobalt (Co) or the like with silicon by annealing processing. The silicide layer 22 is formed on the capacitor electrode 21, the drain layer 17, the source layer 16, and the P+ diffusion layer 19.

Due to the silicide layer 22 which covers the source layer 16 and the P+ diffusion layer 19, the source layer 16 and the P+ diffusion layer 19 are electrically connected, and the source layer 16 is also connected to the channel region 18 in which are diffused impurities of the same type as the P+ diffusion layer 19.

An electrostatic capacity C1 (electrostatic capacity C1 of the MOS capacitor, refer to FIG. 6) between the capacitor electrode 21 of the MOS capacitor 9 and the floating gate electrode 13, an electrostatic capacity C2 (electrostatic capacity C2 of the source layer side, refer to FIG. 6) between the channel region 18 and the floating gate electrode 13 which are connected by the source layer 16 of the nMOS element 8 and the silicide layer 22 and the P+ diffusion layer 19, and an electrostatic capacity C3 (electrostatic capacity C3 of the drain layer side, refer to FIG. 7) between the drain layer 17 of the nMOS element 8 and the floating gate electrode 13, are set such that C3<C2<C1, by adjusting the capacitor surface area (the surface area over which the capacitor electrode 21 and the floating gate electrode 13 oppose one another) and the MOSFET surface area (the surface area over which the source layer 16 and the channel region 18, and the floating gate electrode 13 oppose one another, or the surface area over which the drain layer 17 and the floating gate electrode 13 oppose one another) or the gate width E.

In this case, it is preferable that the relationship between the electrostatic capacities C1 and C3 is set such that C3<<C1.

Reference numeral 25 denotes a first interlayer insulating film, and is an insulating film formed from an insulating material such as silicon oxide or the like, and covers the MOS capacitor 9 and the nMOS element 8 formed on the SOI layer 4.

Reference numeral 26 is a second interlayer insulating film, and is an insulating film formed from an insulating material such as silicon oxide or the like, and covers the first interlayer insulating film 25 formed on the SOI layer 4.

Reference numeral 28 denotes contact plugs, and are plugs which are formed by burying a conductive material such as tungsten (W) or the like into respective contact holes 29 which pass through the first interlayer insulating film 25 and open as through-holes which reach the source layer 16 of the nMOS element 8, the drain layer 17 of the nMOS element 8, and the silicide layer 22 on the capacitor electrode 21 of the MOS capacitor 9.

As shown in FIG. 2, the contact plug 28, which is connected to the source layer 16 of the nMOS element 8 and the P+ diffusion layer 19 via the silicide layer 22, is electrically connected to a source line 31 (SL) which serves as a first control line and is formed on the first interlayer insulating film 25. The contact plug 28, which is connected to the drain layer 17 of the nMOS element 8 via the silicide layer 22, is electrically connected to a relay wiring line 32 formed on the first interlayer insulating film 25. As shown in FIG. 3, the contact plug 28, which is connected to the capacitor electrode 21 of the MOS capacitor 9 via the silicide layer 22, is electrically connected to a word line 33 (WL) which serves as a third control line and is formed on the first interlayer insulating film 25.

Reference numeral 35 denotes a via plug, and is a plug which is formed by burying a conductive material such as tungsten (W) or the like into a via hole 36 which passes-through the second interlayer insulating film 26 and opens as a through-hole reaching the relay wiring line 32 formed on the first interlayer insulating film 25.

The via plug 35 connected to the relay wiring line 32 is electrically connected to a bit line 37 (BL) which serves as a second control line and is formed on the second interlayer insulating film 26. In this way, the drain layer 17 of the nMOS element 8 is electrically connected to the bit line 37.

The source line 31, the relay wiring line 32, the word line 33, and the bit line 37 of the present exemplary embodiment are formed of a wiring material having relatively superior conductivity, such as aluminum (Al), copper (Cu), or the like.

Reference numeral 38 denotes the element isolating layer, and is formed at the SOI layer 4 of the element isolating region 7 and is formed of an insulating material such as silicon oxide or the like, and serves as an insulating film which reaches the buried oxide film 3. The element isolating layer 38 functions so as to electrically insulate and isolate the mutually-adjacent capacitor forming regions 5 of the SOI layer 4, and so as to electrically insulate and isolate the capacitor forming region 5 and the transistor forming region 6.

The storage element 11 of the present exemplary embodiment is formed so as to have line symmetry with respect to the adjacent storage element 11. The respective contact plugs 28 connected to the source line 31, the relay wiring line 32, the word line 33, and the bit line 37 are also used as the respective contact plugs 28 of the adjacent storage elements 11.

In FIG. 5, reference numeral 41 denotes a resist mask, and is a mask member which is formed by exposing and developing a positive or negative resist which is applied on the semiconductor substrate 1 by photolithography. The resist mask 41 functions as a mask in the etching and ion injection of the present exemplary embodiment.

Hereinafter, the method of fabricating the semiconductor storage device of the present exemplary embodiment will be described in accordance with the steps denoted by P in FIG. 5.

Note that, in FIG. 5, the right side of each step shows, in a cross-section similar to FIG. 2, the method of fabricating the nMOS element 8 which is shown at the right side in FIG. 2. The left side of each step in FIG. 5 shows, in a cross-section similar to FIG. 3, the method of fabricating the MOS capacitor 9.

(Step P1)

The semiconductor substrate 1 is prepared in which the capacitor forming regions 5 and the transistor forming regions 6 and the element isolating regions 7 surrounding the peripheries of the both, are set at the SOI layer 4 of the semiconductor substrate 1 at which the SOI layer 4, in which a relatively low concentration of P-type impurities (P−) is diffused, is layered on the supporting substrate 2 via the buried oxide film 3. The element isolating layer 38, which reaches the buried oxide film 3, is formed by STI (Shallow Trench Isolation) or LOCOS (Local Oxidation Of Silicon) at the element isolating regions 7 of the SOI layer 4, i.e., between the transistor forming regions 6 and the capacitor forming regions 5.

(Step P2)

A silicon oxide film 12a, which is formed of silicon oxide and is for forming the gate insulating film 12, is formed by thermal oxidation or CVD (Chemical Vapor Deposition). A polysilicon film 13a, which is for forming the floating gate electrode 13, is deposited on the silicon oxide film 12a by CVD.

(Step P3)

The resist mask 41 (not shown), which covers the floating gate electrode 13 forming region, is formed on the polysilicon film 13a by photolithography. The exposed polysilicon film and silicon oxide film 12a are etched by dry etching or the like such that the SOI layer 4 is exposed. The floating gate electrode 13, which divides the SOI layer 4 of the transistor forming region 6 in two and which covers a portion on the SOI layer 4 of the capacitor forming region 5 and which opposes the respective SOI layers 4 via the gate insulating film 12, is formed. After removal of the resist mask 41, a silicon oxide film is formed by thermal oxidation or CVD on the floating gate electrode 13 and the SOI layer 4 and the like. The entire surface on the SOI layer 4 is etched by anisotropic etching so that the top surface of the floating gate electrode 13 and the top surface of the SOI layer 4 are exposed, and the insulating films 14 are formed at the side surfaces of the floating gate electrode 13.

Then, the resist mask 41, which has opening portions which expose the SOI layer 4 of the capacitor forming region 7, the SOI layer 4 of the region forming the drain layer 17 of the nMOS element 8 of the transistor forming region 6, and the SOI layer 4 of the region forming the source layer 16 except for the region forming the P+ diffusion layer 19 adjacent to the floating gate electrode 13, is formed by photolithography. By using this as a mask, a high concentration of N-type impurities is ion-implanted on the respective SOI layers 4, and the source layer 16 and the drain layer 17 are formed at the SOI layer 4 at both sides of the floating gate electrode 13, and the capacitor electrode 21 is formed at the SOI layer 4 of the capacitor forming region 5.

In this way, the channel region 18 is formed under the floating gate electrode 13 which is sandwiched between the source layer 16 and the drain layer 17, and a high concentration of N-type impurities is injected into the region of the capacitor electrode 21 which is not covered by the floating gate electrode 13.

(Step P4)

The resist mask 41 used in the injecting of the N-type impurities is removed, and the resist mask 41 (not shown), which has an opening portion which exposes a region adjacent the floating gate electrode 13 of the region where the source layer 16 of the nMOS element 8 is formed, i.e., a portion of the SOI layer 4 at the end portion of the source layer 16 adjacent to the channel region 18 in a vicinity of the interface between the source layer 16 and the channel region 18, is formed on the SOI layer 4 of the transistor forming region 6 by photolithography. By using this as a mask, a high concentration of P-type impurities is ion-implanted on the SOI layer 4, and the P+ diffusion layer 19 is formed at the source layer 16.

The aforementioned resist mask 41 is removed, and a siliciding material layer is formed by sputtering over the entire surface, i.e., the floating gate electrode 13, the insulating films 14, the source layer 16 including the P+ diffusion layer 19, the drain layer 17, the capacitor electrode 21, and the element isolating layer 38. By a siliciding treatment which includes annealing at 500° C., the siliciding material layer on the source layer 16 including the P+ diffusion layer 19, the drain layer 17, and the capacitor electrode 21 is silicided, and the silicide layer 22 which covers the aforementioned respective diffusion layers is formed. The siliciding treatment in this case is the processings from the implementing of the annealing to the removal of the unneeded siliciding material layer.

In this way, the silicide layer 22 is formed on the source layer 16 and the P+ diffusion layer 19, and the source layer 16 and the P+ diffusion layer 19 are electrically connected thereby.

(Step P5)

A thick silicon oxide film is formed by CVD on the SOI layer 4 including the nMOS element 8, the MOS capacitor 9, and the element isolating layer 38 which were formed as described above. The top surface thereof is planarized, and the first interlayer insulating film 25 is formed.

After the first interlayer insulating film 25 is formed, the resist mask 41 (not shown), which has openings which expose the first interlayer insulating film 25 of the contact hole 29 forming regions above the source layer 16 of the nMOS element 8, the drain layer 17 of the nMOS element 8, and the capacitor electrode 21 of the MOS capacitor 9, is formed on the first interlaying insulating film 25 by photolithography. By using this as a mask, the contact holes 29, which pass-through the first interlayer insulating film 25 and reach the silicide layer 22 on the source layer 16, the drain layer 17 and the capacitor electrode 21, are formed by anisotropic etching.

The aforementioned resist mask 41 is removed, and a conductive material is buried within the contact holes 29 by sputtering or the like so as to form the contact plugs 28. The top surfaces thereof are planarized, and the top surface of the first interlayer insulating film 25 is exposed.

Next, a wiring layer formed from a wiring material is formed by sputtering or the like on the first interlayer insulating film 25. The wiring layer is patterned by photolithography and etching, and the source line 31 (SL) which is connected to the source layer 16 of the nMOS element 8 via the contact plug 28 and the silicide layer 22, the relay wiring line 32 which is connected to the drain layer 17 via the contact plug 28 and the silicide layer 22, and the word line 33 (WL) which is connected to the capacitor electrode 21 of the MOS capacitor 9 via the contact plug 28 and the silicide layer 22, are formed.

Thereafter, in the same way as in step P5, the second interlayer insulating film 26 is formed on the first interlayer insulating film 25, and the via plug 35 is formed by burying a conductive material into the via hole 36 which passes through the second interlayer insulating film 26 and reaches the relay wiring line 32. The bit line 37, which is connected to the drain layer 17 of the nMOS element 8 via the via plug 35, the relay wiring line 32 and the contact plug, is formed on the second interlayer insulating film 26. The semiconductor storage device having the storage element 11 of the present exemplary embodiment shown in FIGS. 1 through 3 is thereby formed.

When erasing the data of the storage element 11 which is formed in this way, as shown in FIG. 6, the bit line 37 (BL) which is connected to the drain layers 17 of the nMOS elements 8 of all of the storage elements 11 is set in an open state (a state in which it is not electrically connected to anything, or a state of high impedance), and the word line 33 (WL) which is connected to the capacitor electrode 21 of the MOS capacitor 9 is grounded (GND: 0 V), and voltage of 10 to 15 V is applied to the source line 31 (SL) which is connected to the source layer 16 which is connected to the channel region 18 via the P+ diffusion layer 19 by the silicide layer 22 of the nMOS element 8.

At this time, because the drain layer 17 of the nMOS element 8 is in an open state, only the electrostatic capacity $C_2$ of the source layer 16 side is effective as the electrostatic capacity of the nMOS element 8. The electrostatic capacity $C_1$ of the MOS capacitor 9 and the electrostatic capacity $C_2$ of the nMOS element 8 are set such that $C_1<C_2$. Therefore, a state arises in which the voltage, which is applied to the source layer 16, is substantially applied to the gate insulating film 12 of the MOS capacitor 9 due to the capacitance coupling. The electric field applied to the MOS capacitor 9 becomes high, and FN (Fowler Nordheim) tunnel current (FN current) flows from the capacitor electrode 21 toward the floating gate electrode 13 which is in a floating state, and electrons are injected in the floating gate electrode 13.

In this case, the electric field between the floating gate electrode 13 of the nMOS element 8 and the channel region 18 does not become high due to the capacitance coupling, and therefore, FN current does not flow through the gate insulating film 12 of the nMOS element 8.

In this way, charges (electrons in the present exemplary embodiment) accumulate in the floating gate electrode 13, the threshold voltage of the nMOS element 8 rises, and the threshold voltages of all of the storage elements 11 become a high state, i.e., an erased state.

This state is a state in which "1" is written as the data at the storage element 11, and the erased state in the present exemplary embodiment corresponds to a state in which the data "1" is written at all of the storage elements 11.

When the data "0" is to be written at the storage element 11, the storage element 11 to which the data is to be written is specified, and, as shown in FIG. 6, the source line 31 (SL), which is connected to the source layer 16 which is connected to the channel region 18 via the P+ diffusion layer 19 by the silicide layer 22 of the nMOS element 8 of that storage element 11, is set in an open state. Voltage of −2 to −3 V is applied to the word line 33 (WL) connected to the capacitor electrode 21 of the MOS capacitor 9, and voltage of 10 to 14 V is applied to the bit line 37 (BL) connected to the drain layer 17 of the nMOS element 8.

At this time, the channel region 18 and the source layer 16, which are connected via the P+ diffusion layer 19 by the silicide layer 22 of the nMOS element 8, are in open states. Therefore, of the electrostatic capacity of the nMOS element 8, only the electrostatic capacity C3 at the drain layer 17 side is effective. Because the electrostatic capacity C1 of the MOS capacitor 9 and the electrostatic capacity C3 of the nMOS element 8 are set such that C1>C3, the majority of the voltage is applied between the floating gate electrode 13 and the drain layer 17 of the nMOS element 8 due to the capacitance coupling. FN current flows there, charges (in the present exemplary embodiment, electrons), which have accumulated at the floating gate electrode 13 which is in a floating state, are removed from the floating gate electrode 13 to the drain layer 17, a state arises in which no charges exist at the floating gate electrode 13, and the threshold voltage of the nMOS element 8 becomes low.

Note that, in a case in which a specific storage element 11 is made to storage the data "1", there is no need to carry out the above-described operation of writing the data "0" to the specified storage element 11 in the erased state.

When the data written in the storage element 11 in this way is to be read, a voltage of 2 to 3 V is applied to the word line 33 (WL) connected to the capacitor electrode 21 of the MOS capacitor 9, and a voltage of about 1 V is applied to the bit line 37 (BL) connected to the drain layer 17 of the nMOS element 8.

In this case, when the storage element 11 is in an erased state or in a state in which the data "1" is written, the threshold voltage of the nMOS element 8 is high. Therefore, drain current does not flow to the source line 31 (SL) which is connected to the source layer 16 of the nMOS element 8. When there is a state in which the data "0" is written in the storage element 11, the threshold voltage of the nMOS element 8 is low, and therefore, drain current flows to the source line 31 (SL).

The reading operation, which reads the data "1" or the data "0" written in the storage element 11, is carried out in accordance with the determination of the absence or presence of this drain current.

As described above, at the storage element 11 of the present exemplary embodiment, at the time of erasing or at the time of writing the data "0", the drain layer 17 or the source layer 16, to which the channel region 18 is connected via the silicide layer 22 and the P+ diffusion layer 19, is set in an open state. Therefore, a high voltage is not applied between the source layer 16 and the drain layer 17 of the nMOS element 8.

Further, by setting the drain layer 17 or the source layer 16 in an open state, the electrostatic capacity of the nMOS element 8 is varied, and, by utilizing the capacitance coupling due thereto, it is possible to inject or remove electrons in or from the floating gate electrode 13. Even at the storage element 11 which uses the nMOS element 8 of an SOI structure in which the withstand voltage between the source and drain is low, an electrically rewritable, nonvolatile memory having excellent reliability can be obtained.

In this way, an electrically rewritable, nonvolatile memory can be outfitted at a semiconductor storage device having an SOI structure, and the semiconductor storage device can be made to be compact and thin.

As described above, in the present exemplary embodiment, an nMOS element and a MOS capacitor, which are insulated and isolated by an element isolating layer, are formed on an SOI layer of a semiconductor substrate having an SOI structure. A common floating gate electrode is provided which, across a gate insulating film, opposes a channel region and a capacitor electrode which are formed at respective SOI layers. A P+ diffusion layer which contacts the channel region is formed at a source layer in a vicinity of the boundary between the channel region and the source layer of the nMOS element. The P+ diffusion layer and the source layer are covered by a silicide layer. In this way, the source layer or the drain layer, which is electrically connected to the channel region via the P+ diffusion layer by the silicide layer, is set in an open state, and the electrostatic capacity of the nMOS element can be varied. By utilizing the capacitance coupling with the MOS capacitor, the injection of electrons into or the removal of electrons from the floating gate electrode is possible regardless of the withstand voltage between the source and the drain. Even at a semiconductor storage device using an nMOS element of an SOI structure in which the withstand voltage between the source and drain is low, an electrically rewritable, nonvolatile memory having excellent reliability can be formed.

The electrostatic capacity C1 of the MOS capacitor is set between the electrostatic capacity C2, which is between the floating gate electrode and the channel region connected via the P+ diffusion layer and the source layer of the nMOS element, and the electrostatic capacity C3 between the drain layer and the floating gate electrode. In this way, if the drain layer is set in an open state, electrons can easily be injected from the capacitor electrode into the floating gate electrode due to the capacitance coupling, and, if the source layer is set in an open state, electrons can easily be removed from the floating gate electrode to the drain layer due to the capacitance coupling.

Second Exemplary Embodiment

Figure 8:
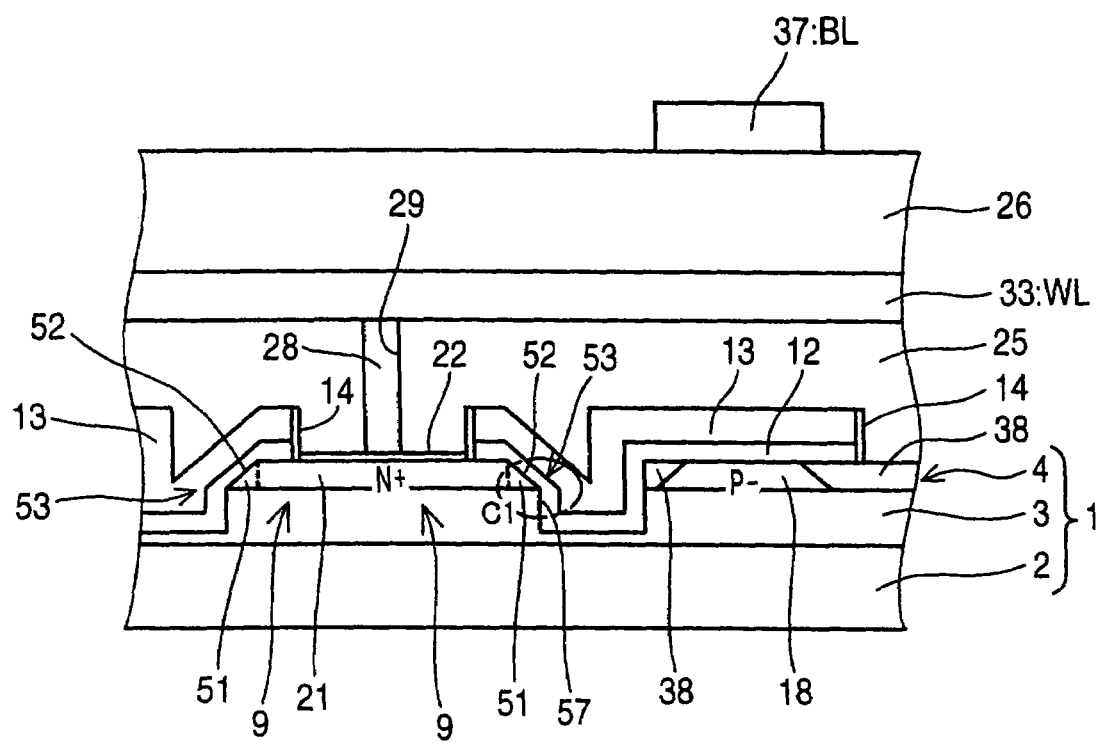
FIG. 8 is an explanatory drawing showing a cross-section of a MOS capacitor of a second exemplary embodiment.
Figure 9:
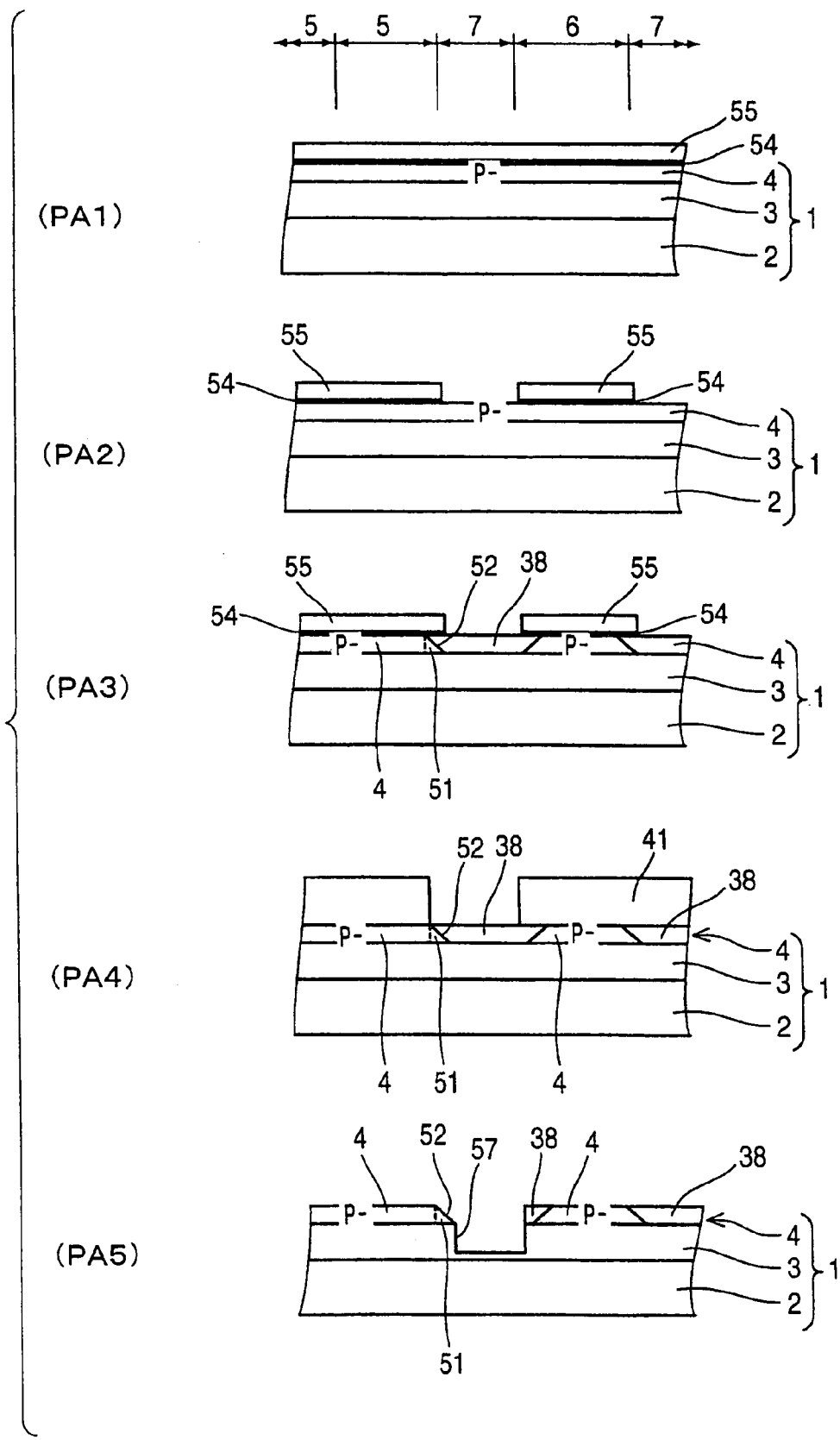
FIG. 9 is an explanatory drawing showing a method of fabricating a semiconductor storage device of the second exemplary embodiment.
Figure 10:
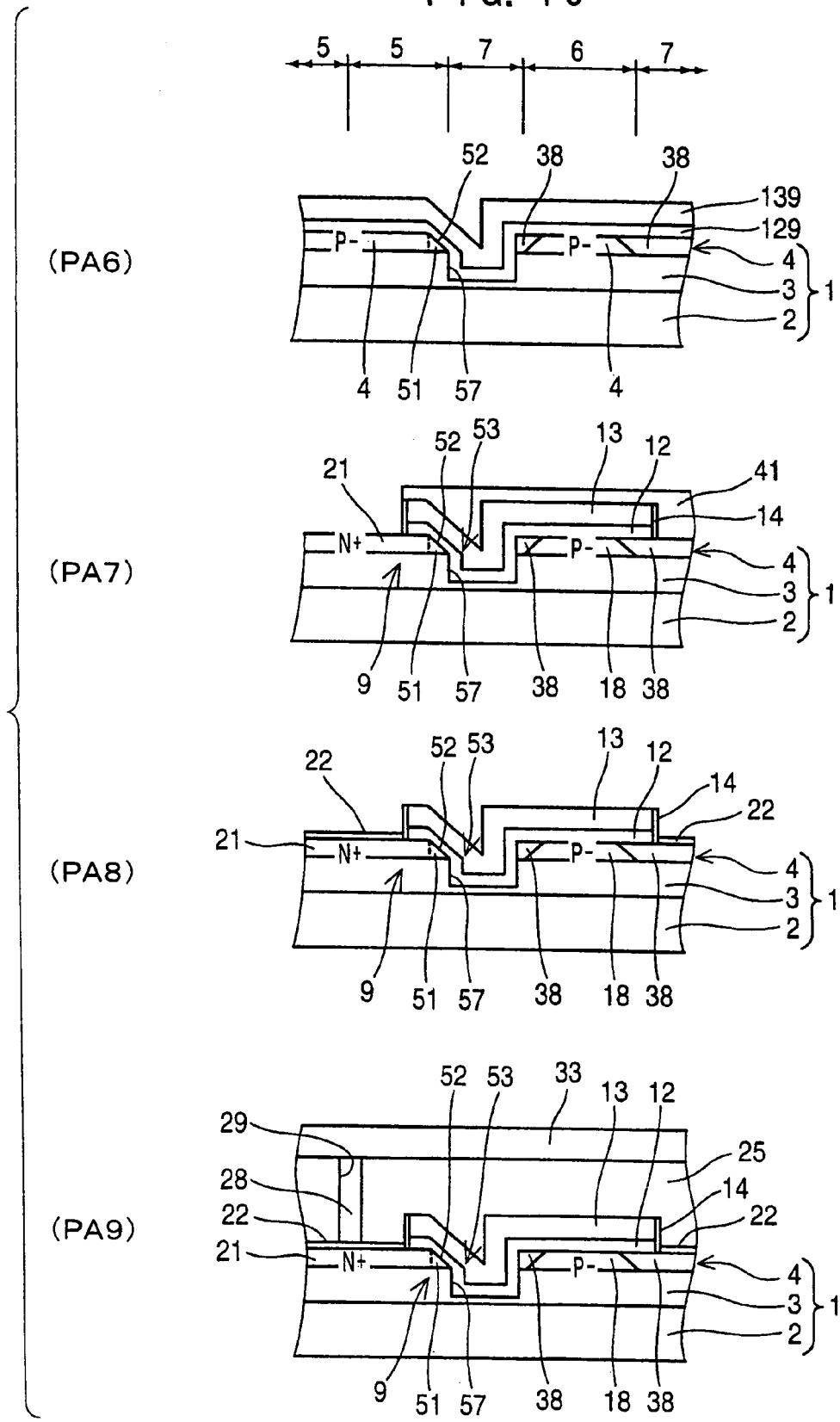
FIG. 10 is an explanatory drawing showing the method of fabricating the semiconductor storage device of the second exemplary embodiment.

FIG. 8 is an explanatory drawing showing a cross-section of a MOS capacitor of a second exemplary embodiment, and FIG. 9 and FIG. 10 are explanatory drawings showing a method of fabricating a semiconductor storage device of the second exemplary embodiment.

Note that FIG. 8 shows a cross-section which is taken along the same cross-sectional line as FIG. 3 of the above-described first exemplary embodiment. Further, portions which are similar to those of the first exemplary embodiment are denoted by the same reference numerals, and description thereof is omitted.

In FIG. 8, reference numeral 51 denotes a projecting portion which is formed at the floating gate electrode 13 side of the capacitor electrode 21 which is formed by diffusing a high concentration of N-type impurities in the SOI layer 4. The projecting portion 51 has an inclined surface 52 which spreads toward the buried oxide film 3. The distal end portion of the projecting portion 51 opposes an opposing portion 53 of the floating gate electrode 13 across the gate electrode film 12.

This projecting portion 51 can be formed as follows for example: when forming the element isolating layer 38 by oxidizing the SOI layer 4 by using, as a mask, a silicon nitride film 55 which serves as an anti-oxidation film on a pad oxide film 54 (see FIG. 9) by LOCOS, the projecting portion 51 is formed by using a bird's beak having a substantially triangular cross-sectional configuration which is formed by the distal end of the element isolating layer 38 penetrating into the boundary portion between the SOI layer 4 and the silicon nitride film 55 of the capacitor forming region 5.

Or, when forming the isolating trench for forming the element isolating layer 38 by STI, the inclined surface 52 can be formed at the end portion of the SOI layer 4 by using anisotropic etching, and the projecting portion 51, which has a substantially triangular cross-sectional configuration in which the inclined surface 52 is formed at the side wall of the isolating trench, can be formed at the end portion of the SOI layer 4.

Reference numeral 57 denotes a capacitor trench, and the floor surface thereof is formed within the buried oxide film 3 by digging, to the buried oxide film 3, the projecting portion 51 formed at the end portion of the capacitor electrode 21 and the element isolating layer 38 at the region adjacent to the projecting portion 51, and further, by digging the buried oxide film 3 deeper than the film thickness of the gate insulating film 12. The length of the capacitor trench 57, in the direction along the side of the end portion of the capacitor electrode 21, is greater than the length in the direction of the gate length Lg of the floating gate electrode 13.

The distal end portion of the projecting portion 51 is formed to be slender, and the distal end portion opposes the opposing portion of the floating gate electrode 13 across the gate insulating film 12. Therefore, the projecting portion 51 functions to make it easy for an electric field concentration to arise at the MOS capacitor 9 at the time of the erasing operation.

A method of fabricating the semiconductor storage device of the present exemplary embodiment will be described hereinafter in accordance with the steps denoted by PA in FIG. 9 and FIG. 10.

Note that only the method of fabricating the MOS capacitor 9 is shown in FIG. 9 and FIG. 10.

(Step PA1) (FIG. 9)

The semiconductor substrate 1 which is similar to that of step P1 is prepared, and the pad oxide film 54 whose film thickness is thin is formed on the SOI layer 4 by thermal oxidation. The silicon nitride film 55, which has a relatively thick film thickness, is formed on the pad oxide film 54 by CVD.

In this case, in order to ensure an effective surface area of the MOS capacitor 9 and the nMOS element 8, the capacitor forming region 5 and the transistor forming region 6 which are set at the SOI layer 4 are set to be wider, by an amount corresponding to the projecting portion 51, than in the case of the first exemplary embodiment.

(Step PA2) (FIG. 9)

The resist mask 41 (not shown), which covers the capacitor forming region 5 and the transistor forming region 6 and exposes the silicon nitride film 55 of the element isolating region 7, is formed on the silicon nitride film 55 by photolithography. By using this as a mask, the silicon nitride film 55 and the pad oxide film 54 are etched by anisotropic etching, such that the SOI layer 4 is exposed.

(Step PA3) (FIG. 9)

The resist mask 41 formed in step PA2 is removed. By LOCOS using the exposed silicon nitride film 55 as a mask, the SOI layer 4 is oxidized, and the element isolating layer 38 which reaches the buried oxide film 3 is formed between the transistor forming region 6 and the capacitor forming region 5.

At this time, the silicon nitride film 55 side of the SOI layer 4 is oxidized and a bird's beak is formed, and the projecting portion 51 having the inclined surface 52 is formed at the floating gate electrode 13 side of the SOI layer 4.

(Step PA4) (FIG. 9)

The silicon nitride film 55 and the pad oxide film 54 are removed by wet etching using hot phosphoric acid (hot $H_3PO_4$) and hydrofluoric acid (HF), such that the SOI layer 4 is exposed.

Then, the resist mask 41 which has an opening portion exposing the element isolating layer 38, which is above the projecting portion 51 formed at the end portion of the SOI layer 4 and which is at the region adjacent to the projecting portion 51, is formed by photolithography.

(Step PA5) (FIG. 9)

By using the resist mask 41 formed in step PA4 as a mask, the element isolating layer 38 and the buried oxide film 3 are etched by wet etching using hydrofluoric acid or the like. The capacitor trench 57, which has a bottom surface within the buried oxide film 3 and which exposes the projecting portion 51, is formed. Thereafter, the resist mask 41 formed in step PA4 is removed.

(Step PA6) (FIG. 10)

The silicon oxide film 129, which is formed of silicon oxide and is for forming the gate insulating film 12, is formed by thermal oxidation or CVD on the SOI layer 4 and the element isolating layer 38 of the capacitor forming region 5 and the transistor forming region 6, and on the inner surface of the capacitor trench 57. The polysilicon film 139 for forming the floating gate electrode 13 is formed by CVD on the silicon oxide film 129.

In this way, the opposing portion, which opposes the distal end portion of the projecting portion 51 across the gate insulating film 12, is formed at the floating gate electrode 13 which is formed in the next step.

Because the operations of steps PA7 through PA9 (FIG. 10) thereafter are similar to the operations of steps P3 through P5 (FIG. 5) of the first exemplary embodiment, description thereof is omitted.

The erasing operation, the writing operation, and the reading operation of the above-described storage element 11, in which the projecting portion 51 is formed at the capacitor electrode 21, are similar to those of the case of the above-described first exemplary embodiment, and therefore, description thereof is omitted.

In the erasing operation in this case, when the above-described state arises in which the voltage applied to the source layer 16 is substantially applied to the gate insulating film 12 of the MOS capacitor 9 due to the capacitance coupling, because the distal end portion of the projecting portion 51 opposes the opposing portion 53 of the floating gate electrode 13 across the gate insulating film 12, an electric field concentration arises at this region. The electric field applied to the MOS capacitor 9 becomes even higher, it becomes easy for the FN current to flow from the capacitor electrode 21 toward the floating gate electrode 13, and the injection of electrons into the floating gate electrode 13 can be carried out more easily.

In this case, even if a projecting portion were formed at the source layer 16 of the nMOS element 8, the distal end portion thereof would not oppose the floating gate electrode 13 across the gate insulating film 12. Therefore, an electric field concentration would not arise, and FN current would not flow through the gate insulating film 12 of the nMOS element 8.

This shows that, even in a case in which the capacitance coupling (C1<C2) between the electrostatic capacity C1 of the MOS capacitor 9 and the electrostatic capacity C2 at the source layer 16 side of the nMOS element 8 cannot be made to be large, the injection of electrons into the floating gate electrode is possible. The degrees of freedom in setting the electrostatic capacities C1, C2 of the storage element 11 can be increased, and the operation of the storage element 11 can be made to be better.

Further, this shows that, even if the voltage applied to the source layer 16 is made to be low, the injection of electrons into the floating gate electrode 13 in the erasing operation is possible. The voltage at the time of erasing can be made to be low, and generation of heat at the storage element 11 can be suppressed.

It is described above that, in step PA2, the entire pad oxide film 54 is removed by anisotropic etching. However, all of or a portion of the pad oxide film 54 may be left in the form of a film. In such a case, the cross-sectional configuration of the projecting portion 51 can be made to be a trapezoidal shape in which the flat surface in the direction of thickness is formed at the buried oxide film 3 side. The extent of the electric field concentration arising due to the projecting portion 51 can be varied, and the effect of the electric field concentration which is due to the projecting portion 51 can be added to the effect which is due to the capacitance coupling. The degrees of freedom for setting the electrostatic capacity C1 of the MOS capacitor 9 between the electrostatic capacities C2, C3 of the nMOS element 8 side can be increased, and the voltage settings and the like of the erasing operation and the writing operation of the storage element 11 having the SOI structure can be made to be even easier.

As described above, in the present exemplary embodiment, in addition to effects which are similar to those of the above-described first exemplary embodiment, the projecting portion, at which is formed the inclined surface which spreads toward the buried oxide film, is formed at the floating gate electrode side of the capacitor electrode. By making the distal end portion of this projecting portion oppose the floating gate electrode across the gate insulating film, in the erasing operation of the storage element, the FN current can be made to flow by a low electric field due to the electric field concentration due to the projecting portion. Even in a case in which the capacitance coupling (C1<C2) between the electrostatic capacity C1 of the MOS capacitor and the electrostatic capacity C2 at the source layer side of the nMOS element cannot be made to be large, electrons can easily be injected into the floating gate electrode, and the voltage needed at the time of erasing can be made to be low.

Note that, in the explanation of the fabricating method of the present exemplary embodiment, it is described that the projecting portion 51 is formed by LOCOS, but the projecting portion 51 may be formed by STI.

Hereinafter, the formation of the projecting portion 51 by STI will be described in accordance with steps denoted by SB.

(Step SB1)
The semiconductor substrate 1, which is set in the same way as in above-described step PA1, is prepared. In the same way as in step PA1, the pad oxide film 54 and the silicon nitride film 55 which serves as a stopper nitride film are formed.

(Step SB2)
In the same way as in step PA2, the resist mask 41 which exposes the silicon nitride film 55 of the element isolating region 7 is formed. By anisotropic etching using this as a mask, the silicon nitride film 55, the pad oxide film 54, and the SOI layer 4 are etched such that the buried oxide film 3 is exposed, and the isolating trench which reaches the buried oxide film 3 is formed.

At this time, the top surface side of the SOI layer 4 is etched by anisotropic etching, and the inclined surface 52 is formed. The side wall of the isolating trench is structured by the inclined surface 52, and the projecting portion 51 which has the inclined surface 52 is formed at the end portion of the SOI layer 4.

(Step SB3)
The resist mask 41 formed in step PB2 is removed, silicon oxide is deposited by CVD on the silicon nitride film 55 and within the isolating trench, and a silicon oxide film, which fills-in the isolating trench at least thicker than the SOI layer 4, is formed.

Then, by CMP (Chemical Mechanical Polishing) or mechanical polishing, the deposited silicon oxide film, the silicon nitride film 55, and the pad oxide film 54 are removed such that the SOI layer 4 is exposed. The element isolating layer 38 is formed at the element isolating region 7 between the transistor forming region 6 and the capacitor forming region 5.

This state is similar to the state in above-described step PA4 in which the silicon nitride film 55 and the pad oxide film 54 are removed by wet etching and the SOI layer 4 is exposed.

Because operations thereafter are similar to the operations after above-described step PA4, description thereof is omitted.

In this case as well, the storage element 11 which is similar to that in the case of using LOCOS can be formed.

In this case, when the projecting portion 51 is to be formed in a trapezoidal shape, it suffices to stop the anisotropic etching in step PB2 when the needed inclined surface 52 is formed, and thereafter, to form the isolating trench by anisotropic etching.

Note that, in the above-described respective exemplary embodiments, explanation is given with the respective transistors being nMOS elements, but the same holds for a case in which the transistors are made to be pMOS elements and the types of the impurities of the high-concentration diffusion layers and the capacitor electrodes are reversed.

What is claimed is:

1. A semiconductor storage device comprising:
a semiconductor substrate having a supporting substrate, a buried oxide film on the supporting substrate, and an SOI layer on the buried oxide film;
an element isolating layer insulating and isolating the SOI layer at a transistor forming region and a capacitor forming region which are set at the semiconductor substrate;

a MOSFET on the SOI layer of the transistor forming region; and a MOS capacitor on the SOI layer of the capacitor forming region, wherein the MOSFET includes
- a gate insulating film on the SOI layer,
- a floating gate electrode on the gate insulating film,
- a source layer and a drain layer at the SOI layer at respective sides of the floating gate electrode,
- a channel region between the source layer and the drain layer,
- a high-concentration diffusion layer at the source layer in a vicinity of an interface between the source layer and the channel region, and which contacts the channel region, the high-concentration diffusion layer having impurities of a same type and higher concentration as impurities in the channel region, and
- a silicide layer covering the high-concentration diffusion layer and the source layer, and the MOS capacitor includes
- a capacitor electrode at the SOI layer, the capacitor electrode having impurities of a same type as the source layer at a high concentration,
- the capacitor electrode of the MOS capacitor is disposed so as to oppose an end portion of the floating gate electrode of the MOSFET, with the gate insulating film therebetween,
- the capacitor electrode having a projecting portion including an inclined surface sloped toward the buried oxide film and that is provided at a side end portion of the capacitor electrode near the floating gate electrode, and
- a distal end of the projecting portion opposes the floating gate electrode,
- wherein a trench that extends into the buried oxide film is disposed between the distal end of the projecting portion and the floating gate electrode, the gate insulating film is within the trench.

2. The semiconductor storage device of claim 1, wherein given that an electrostatic capacity between the floating gate electrode and the channel region which are connected by the source layer of the MOSFET and the silicide layer and the high-concentration diffusion layer is C2, and an electrostatic capacity between the floating gate electrode and the drain layer is C3, an electrostatic capacity C1 between the floating gate electrode and the capacitor electrode of the MOS capacitor is such that C3<C1<C2.

3. The semiconductor storage device of claim 1, wherein the drain layer is set in an open state, the capacitor electrode is grounded, positive voltage is applied to the source layer, and charges are injected in the floating gate electrode.

4. The semiconductor storage device of claim 1, wherein the source layer is set in an open state, negative voltage is applied to the capacitor electrode, positive voltage is applied to the drain layer, and charges are removed from the floating gate electrode.

5. A semiconductor storage device comprising:
a semiconductor substrate having a supporting substrate, a buried oxide film on the supporting substrate, and an SOI layer on the buried oxide film;
an element isolating layer insulating and isolating the SOI layer at a transistor forming region and a capacitor forming region of the semiconductor substrate;
a MOSFET on the SOI layer in the transistor forming region, the MOSFET including a gate insulating film on the SOI layer and a floating gate electrode on the gate insulating film; and
a MOS capacitor on the SOI layer in the capacitor forming region, the MOS capacitor including a capacitor electrode in the SOI layer,
the capacitor electrode of the MOS capacitor having a projecting portion with an inclined surface sloped toward the buried oxide layer, the inclined surface disposed to oppose an end portion of the floating gate electrode of the MOSFET,
wherein a trench that extends into the buried oxide layer is disposed between the inclined surface of the projecting portion and the floating gate electrode, the gate insulating film is within the trench.

6. The semiconductor storage device of claim 5, wherein the MOSFET further comprises:
a source layer and a drain layer in the SOI layer at respective sides of the floating gate electrode;
a channel region between the source layer and the drain layer;
a high-concentration diffusion layer in a vicinity of an interface between the source layer and the channel region, and which contacts the channel region, the high-concentration diffusion layer having impurities of a same type and higher concentration as impurities of the channel region; and
a silicide layer covering the high-concentration diffusion layer and the source layer.

7. The semiconductor storage device of claim 6, wherein an electrostatic capacity between the floating gate electrode and the channel region which are connected by the source layer of the MOSFET, the silicide layer and the high-concentration diffusion layer is C2, and an electrostatic capacity between the floating gate electrode and the drain layer is C3, an electrostatic capacity C1 between the floating gate electrode and the capacitor electrode of the MOS capacitor is such that C3<C1<C2.

8. The semiconductor storage device of claim 6, in a charge injection configuration with the drain layer in an open state, the capacitor electrode grounded, and positive voltage applied to the source layer.

9. The semiconductor storage device of claim 6, in a charge removal configuration with the source layer in an open state, negative voltage applied to the capacitor electrode, and positive voltage applied to the drain layer.

* * * * *